(12) United States Patent
Marr

(10) Patent No.: US 7,215,134 B2
(45) Date of Patent: *May 8, 2007

(54) APPARATUS FOR DETERMINING BURN-IN RELIABILITY FROM WAFER LEVEL BURN-IN

(75) Inventor: Kenneth W. Marr, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/131,051

(22) Filed: May 16, 2005

(65) Prior Publication Data

US 2005/0218918 A1    Oct. 6, 2005

Related U.S. Application Data

(60) Continuation of application No. 10/925,543, filed on Aug. 24, 2004, now Pat. No. 6,894,526, which is a division of application No. 10/807,703, filed on Mar. 23, 2004, now Pat. No. 7,038,481, which is a division of application No. 10/207,526, filed on Jul. 29, 2002, now Pat. No. 6,943,575.

(51) Int. Cl.
*G01R 31/26* (2006.01)

(52) U.S. Cl. .................. 324/765; 324/763; 365/201

(58) Field of Classification Search ............ None
See application file for complete search history.

(56) References Cited

U.S. PATENT DOCUMENTS

| | | |
|---|---|---|
| 4,032,949 A | 6/1977 | Bierig |
| 4,455,495 A | 6/1984 | Masuhara et al. |
| 4,534,014 A | 8/1985 | Ames |
| 4,592,025 A | 5/1986 | Takemae et al. |
| 4,707,806 A | 11/1987 | Takemae et al. |
| 5,110,754 A | 5/1992 | Lowrey et al. |
| 5,235,550 A | 8/1993 | Zagar |
| 5,254,943 A | 10/1993 | Momose |
| 5,296,402 A | 3/1994 | Ryou |
| 5,301,143 A | 4/1994 | Ohri et al. |
| 5,313,424 A | 5/1994 | Adams et al. |
| 5,345,110 A | 9/1994 | Renfro |
| 5,352,945 A | 10/1994 | Casper et al. |
| 5,424,652 A | 6/1995 | Hembree et al. |
| 5,428,311 A | 6/1995 | McClure |
| 5,440,240 A | 8/1995 | Wood et al. |
| 5,457,400 A | 10/1995 | Ahmad et al. |
| 5,539,235 A | 7/1996 | Allee |
| 5,539,699 A | 7/1996 | Sato et al. |
| 5,563,832 A | 10/1996 | Kagami |

(Continued)

*Primary Examiner*—Minh N. Tang
(74) *Attorney, Agent, or Firm*—TraskBritt, PC

(57) ABSTRACT

A method, circuit and system for determining burn-in reliability from wafer level burn-in are disclosed. The method according to the present invention includes recording the number of failures in each IC die in nonvolatile elements on-chip at points in time over the duration of wafer level burn-in testing. The number of failures in each IC die, along with their associated points in time, may be used to create burn-in reliability curves which are conventionally derived using other processes that may be less cost effective or not possible to effect with unpackaged IC dice. Circuits and systems associated with the method of the present invention are also disclosed.

19 Claims, 6 Drawing Sheets

U.S. PATENT DOCUMENTS

| | | |
|---|---|---|
| 5,590,069 A | 12/1996 | Levin |
| 5,600,171 A | 2/1997 | Makihara et al. |
| 5,606,193 A | 2/1997 | Ueda et al. |
| 5,617,366 A | 4/1997 | Yoo |
| 5,619,469 A | 4/1997 | Joo |
| 5,677,917 A | 10/1997 | Wheelus et al. |
| 5,768,288 A | 6/1998 | Jones |
| 5,867,505 A | 2/1999 | Beffa |
| 5,895,962 A | 4/1999 | Zheng et al. |
| 5,896,398 A | 4/1999 | Sekine |
| 5,919,269 A | 7/1999 | Ong |
| 5,944,845 A | 8/1999 | Miller, Jr. |
| 5,982,189 A | 11/1999 | Motika et al. |
| 5,991,220 A | 11/1999 | Freyman et al. |
| 6,002,620 A | 12/1999 | Tran et al. |
| 6,008,523 A | 12/1999 | Narayan et al. |
| 6,016,265 A | 1/2000 | Yoshida et al. |
| 6,021,078 A | 2/2000 | Le et al. |
| 6,025,129 A | 2/2000 | Nova et al. |
| 6,118,138 A | 9/2000 | Farnworth |
| 6,127,837 A | 10/2000 | Yamamoto et al. |
| 6,190,972 B1 | 2/2001 | Zheng et al. |
| 6,194,738 B1 * | 2/2001 | Debenham et al. ............ 257/48 |
| 6,212,114 B1 | 4/2001 | Cowles |
| 6,233,182 B1 | 5/2001 | Satou et al. |
| 6,255,837 B1 | 7/2001 | Habersetzer et al. |
| 6,269,035 B1 | 7/2001 | Cowles et al. |
| 6,292,009 B1 | 9/2001 | Farnworth et al. |
| 6,324,657 B1 | 11/2001 | Fister et al. |
| 6,343,366 B1 | 1/2002 | Okitaka |
| 6,353,563 B1 | 3/2002 | Hii et al. |
| 6,365,421 B2 | 4/2002 | Debenham et al. |
| 6,611,458 B2 * | 8/2003 | Ishibashi et al. ........ 365/185.09 |
| 6,630,685 B1 | 10/2003 | Lunde |
| 6,829,737 B1 | 12/2004 | McBride |
| 6,839,873 B1 * | 1/2005 | Moore ......................... 714/725 |
| 6,894,526 B2 * | 5/2005 | Marr ........................... 324/765 |
| 2002/0133767 A1 | 9/2002 | Cowles |
| 2002/0133769 A1 | 9/2002 | Cowles et al. |
| 2002/0133770 A1 | 9/2002 | Cowles et al. |

\* cited by examiner

APPARATUS FOR DETERMINING BURN-IN RELIABILITY FROM WAFER LEVEL BURN-IN

CROSS-REFERENCE TO RELATED APPLICATIONS

This application is a continuation of application Ser. No. 10/925,543, filed Aug. 24, 2004, now U.S. Pat. 6,894,526, issued May 17, 2005, which is a divisional of application Ser. No. 10/807,703, filed Mar. 23, 2004, now U.S. Pat. No. 7,038,481, issued May 2, 2006, which is a divisional of application Ser. No. 10/207,526, filed Jul. 29, 2002, now U.S. Pat. No. 6,943,575, issued Sep. 13, 2005, which is related to U.S. patent application Ser. No. 08/946,027, filed Oct. 7, 1997, now U.S. Pat. No. 6,190,972, issued Feb. 20, 2001 and U.S. patent application Ser. No. 09/651,858, filed Aug. 30, 2000, now U.S. Pat. No. 6,829,737, issued Dec. 7, 2004.

TECHNICAL FIELD

This invention relates generally to integrated circuit (IC) test circuits and methods. In particular, the present invention relates to storage of wafer level burn-in test data on the IC device under test and, more particularly, the storage and retrieval of wafer level burn-in data to and from nonvolatile memory elements in the IC device for generating burn-in reliability curves.

BACKGROUND OF THE INVENTION

Semiconductor IC devices are manufactured on wafers or other bulk substrates of semiconductor material. Conventionally, many devices are manufactured on a single wafer and individual devices or groups of devices are singulated from the wafer and packaged. The IC devices are tested at various points during the manufacturing process, i.e., with electrical probes while they are still on the wafer and then after packaging. The terms "IC," "device" and "IC device" are used interchangeably herein.

During testing, a particular signal or combination of signals is input to the IC device and the output value or values read from the device are compared with expected values from a properly functioning device. Tests may involve a particular signal or combination of signals being delivered repetitively, perhaps under extreme environmental conditions (temperature, voltage, etc.) in order to identify a device which would fail after a shorter than usual period of use ("burn-in" testing). Other tests may involve a number of different signals or signal combinations delivered in sequence. One method for testing a memory device is to deliver the same signal or signal combination to multiple identical subsections of a memory array in the memory device simultaneously and compare the values read from the subsections ("compression testing"). If all of the respective read values match, the test has been passed, while a mismatch between respective values read from any of the subsections indicates a memory device malfunction and failure of the test.

A particular test or test sequence often includes multiple test steps. Moreover, a complete test flow will often require that IC devices move from one piece of test equipment to another. For example, a first piece of test equipment and test fixtures may be utilized for probe testing, another for burn-in testing and yet another for packaged device testing after burn-in.

After a particular test or test sequence has been completed, IC devices that have failed some portion, or all, of a test may be separated from the good devices. However, an IC device that has failed one portion of the test sequence may pass subsequent test sequences. So, if the failing IC device is erroneously placed into the "good" bin and then passes subsequent tests, it may eventually be classified and sold as fully functional. One way to avoid this type of error is to store information regarding the test history of the device on the device itself in nonvolatile memory elements. One example describing storage of test results in nonvolatile memory on a semiconductor device is co-pending U.S. Pat. No. 6,190,972, issued Feb. 20, 2001, the disclosure of which is hereby incorporated herein by reference for all purposes. A method and system of storing device test information on a semiconductor device using on-device logic for determination of test results are disclosed in co-pending U.S. Pat. No. 6,829,737, issued Dec. 7, 2004, the disclosure of which is hereby incorporated herein by reference for all purposes.

Defects in a finished IC chip assembly can prevent it from operating as intended. In spite of painstaking attention to detail, defects may be introduced at various levels of production. For example, manufacturing defects in the IC die may cause a failure. It has been found, however, that some defects manifest themselves immediately, while other defects manifest themselves only after the IC die has been operated for some period of time.

"Burn-in" refers to the process of accelerating failures that occur during the infant mortality phase of component life in order to remove the inherently weaker ICs. Burn-in testing has been regarded as a critical process for assuring product reliability since the semiconductor industry began. There are various types of conventional burn-in testing. During a process known as "static" burn-in (also referred to as "dumb" burn-in testing), temperatures may be increased (or sometimes decreased) while the pins are biased but not toggled. No data is written to the IC, nor is the IC exercised under stress during static burn-in. During "unmonitored dynamic" burn-in testing, temperatures may be increased while the pins on the test IC are toggled. For a memory IC undergoing unmonitored dynamic burn-in testing, data patterns are written to the memory IC, but not read, while being cycled under stress. Hence, with unmonitored dynamic burn-in testing, there is no way of knowing whether the data written is retained by a memory cell.

In recent years, as memory systems have grown in complexity, the need for more reliable components has escalated. More sophisticated methods of screening infant mortalities have been developed. As IC manufacturing practices have become more consistent, it has become clear that burn-in systems that simply provide stress stimuli in the form of high temperature and VCC (power) to the IC under test may be inadequate because such burn-in systems cannot detect and screen infant mortality failure rates measured in small fractions of a percent.

To address these issues, an "intelligent" burn-in (sometimes referred to as "smart" burn-in) testing can be utilized. The term "intelligent burn-in," as used in this discussion, refers to the ability to combine functional, programmable testing with the traditional burn-in cycling of an IC under test in the same chamber. Advantages to this approach include: (1) the ability to identify when a failure occurs and, thereby, compute infant mortality rates as a function of burn-in time (and as a result, an optimal burn-in time for each product family may be established); (2) the ability to correlate burn-in failure rates with life test data typically obtained by IC manufacturers to determine the field failure rates of their products; and (3) the ability to incorporate into the burn-in process certain tests traditionally performed using automatic test equipment (ATE) systems, thereby reducing costs.

Reliability curves are used to express an instantaneous failure rate f(t) over time t, and often have a "bathtub" shape. The reliability curves for many, if not all, ICs are generally like that shown in FIG. 1. The reliability curve in FIG. 1 may be divided into three regions: (1) an infant mortality region, (2) a random failures region, and (3) a wearout region.

The infant mortality region begins at time $t_0$, which may occur upon completion of the manufacturing process and initial electrical test. Some ICs, of course, fail the initial electrical test. Inherent manufacturing defects are generally expected in a small percentage of ICs, even though the ICs are functional at time $t_0$. Because of these inherent manufacturing defects (that may be caused by contamination and/or process variability), these ICs have shorter lifetimes than the remaining population. While ICs with failures occurring in the infant mortality region may constitute a small fraction of the total population, they are the largest contributor to early-life failure rates.

Once ICs subject to infant mortality failure rates have been removed from the IC population, the remaining ICs have a very low and stable field failure rate. The relatively flat, bottom portion of the bathtub curve (FIG. 1), referred to as the random failure region, represents stable field-failure rates which occur after the IC failures due to infant mortalities have been removed and before IC wearout occurs. Eventually, as wearout occurs, the failure rate f(t) of the ICs begins to increase rapidly. However, the average lifetime of an IC is not typically well known, because most laboratory tests simulate only a few years of normal IC operation.

FIG. 2 illustrates reliability curves measured for exemplary IC device lots A, B and C. FIG. 2 only includes the front end of the bathtub curve illustrated in FIG. 1 for each device lot. Lot A is characterized by a high instantaneous failure rate f(t) that does not improve after any length of time. Lot B is characterized by a stable failure rate that has improved after the infant mortality region, but remains above a selected manufacturing process standard (dotted line). If devices must meet the selected manufacturing process standard, then lots A and B must be scrapped because the stable failure rates obtained in the random failures region is too high. Lot C is characterized by a stable failure rate that is within the selected manufacturing process standard and, thus, may be considered a good lot and suitable for sale. Burn-in testing provides data for determining instantaneous failure rate curves. Determining the instantaneous failure rate curves serves at least two useful functions: (1) one can determine when burn-in testing is complete, i.e., how long burn-in testing must be performed to weed out the infant mortality failures, and (2) one can determine if burn-in testing will complete, i.e., occasionally lots like A or B illustrated in FIG. 2 occur and must be scrapped because they never clean up.

There are at least four approaches to ensuring IC reliability: (1) evaluation of data on a per-die basis by burn-in stressing at the individual IC die level, (2) evaluation of data on a per-die basis by burn-in stressing at the packaged component level, (3) evaluation of data on a per-wafer basis by burn-in stressing at the wafer level, and (4) evaluation of data on a per-lot basis by analyzing a sample of wafers per lot. The first of these approaches may be impractical if the IC die has failures and before redundancy has been enabled. The second approach is quite common in the industry, but does not allow for identification of infant mortalities until all of the packaging steps have been completed. The fourth approach is unacceptable from a reliability standpoint since any single wafer within a lot may have unique reliability problems.

Thus, there exists a need in the art for a system, circuit and method for determining wafer level burn-in reliability.

SUMMARY OF THE INVENTION

The present invention includes a method, circuit and system for determining burn-in reliability from wafer level burn-in. The method according to the present invention includes recording the number of failures in each IC die in nonvolatile elements on-chip at points in time over the duration of wafer level burn-in testing. The number of failures in each IC die along with their associated points in time may be used to create burn-in reliability curves which are conventionally derived using other processes that may be less cost effective. Circuits and systems associated with the method of the present invention are also disclosed.

Advantages of the method, circuit and system of the present invention include being able to determine burn-in reliability at the wafer level, determining whether all infant mortalities have been identified, determining whether additional wafer level burn-in is necessary or if packaged part burn-in is necessary, determining whether there is a bad wafer in a good lot, or if an entire lot is bad that needs to be scrapped at the wafer level and before packaging and the ability to identify known good dice suitable for higher-order subassemblies or for wafer sales or die sales once singulated.

The embodiments of the present invention will be readily understood by reading the following detailed description in conjunction with the accompanying figures of the drawings.

BRIEF DESCRIPTION OF THE SEVERAL VIEWS OF THE DRAWINGS

The drawings illustrate exemplary embodiments of the present invention, wherein like reference numerals refer to like parts in different views or embodiments in the drawings.

DETAILED DESCRIPTION OF THE INVENTION

The present invention includes a method, circuit and system for determining burn-in reliability from wafer level burn-in. Conventional burn-in reliability curves are generated by burn-in testing packaged parts for failures and making determinations whether to accept or reject the lot associated with the packaged parts. The invention disclosed herein provides the capability of generating burn-in reliability curves by performing wafer level burn-in and measuring defects at the IC die level before the IC die has been packaged. According to the present invention, wafer level burn-in data may be stored in and retrieved from on-chip nonvolatile elements. The present invention facilitates the sale of burned-in dice either in die form or wafer form. For example, wafer-level burned-in dice may be used in multichip modules (MCMs) and other kinds of semiconductor assemblies. The invention may also provide an early measure of burn-in reliability and provides process engineers with information that may be used to accept or reject a wafer or lot associated with the IC die subject to wafer level burn-in testing.

Once a bulk substrate has been processed to form a plurality of IC dice thereon, a sacrificial layer of metal may be applied to the bulk substrate to deliver power VCC, ground GND and any other signal(s) necessary to perform burn-in testing to each IC die. According to the present invention, another signal may be a supply voltage, CMN, for programming nonvolatile elements such as antifuses. A supply voltage, CMN, may be referred to herein as an "antifuse supply CMN." A supervoltage level on the antifuse supply CMN may be used to signal a transition between cycles of burn-in testing as described below. As known to one of ordinary skill in the art, nonvolatile elements may be programmed using voltages substantially above (supervoltage) the nominal voltage of the power supply, VCC, depending on the technology used to implement the nonvolatile storage. The sacrificial metal layer may be used to perform the wafer level burn-in according to the present invention. After the wafer level burn-in is complete, the sacrificial metal layer may be removed. The application and removal of metal layers are within the knowledge of one of ordinary skill in the art and, thus, will not be further elaborated upon herein. Of course, one of ordinary skill in the art will recognize that other semiconductor technologies may employ different voltage supplies and methods of delivering power to individual IC dice consistent with the present invention.

Figure 1:
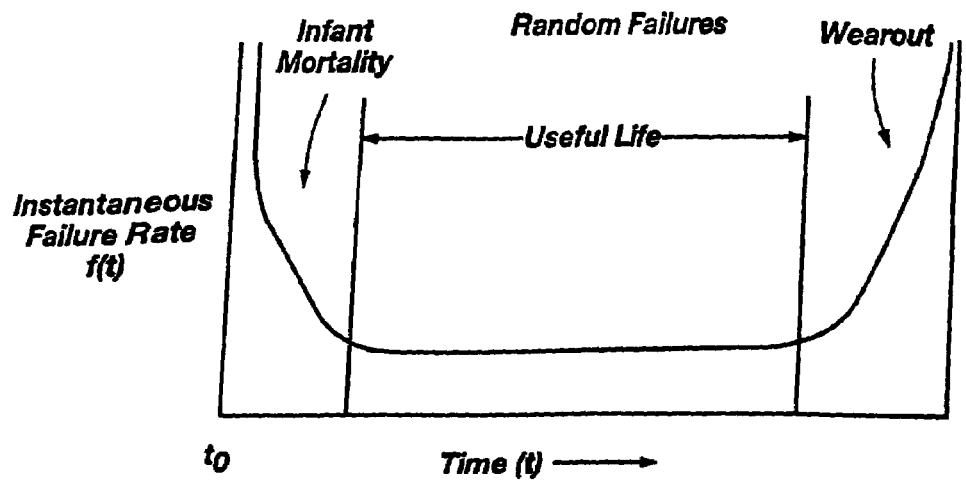
FIG. 1 is a graphical representation of a reliability curve that expresses an instantaneous failure rate f(t) as a function of time, t.
Figure 2:
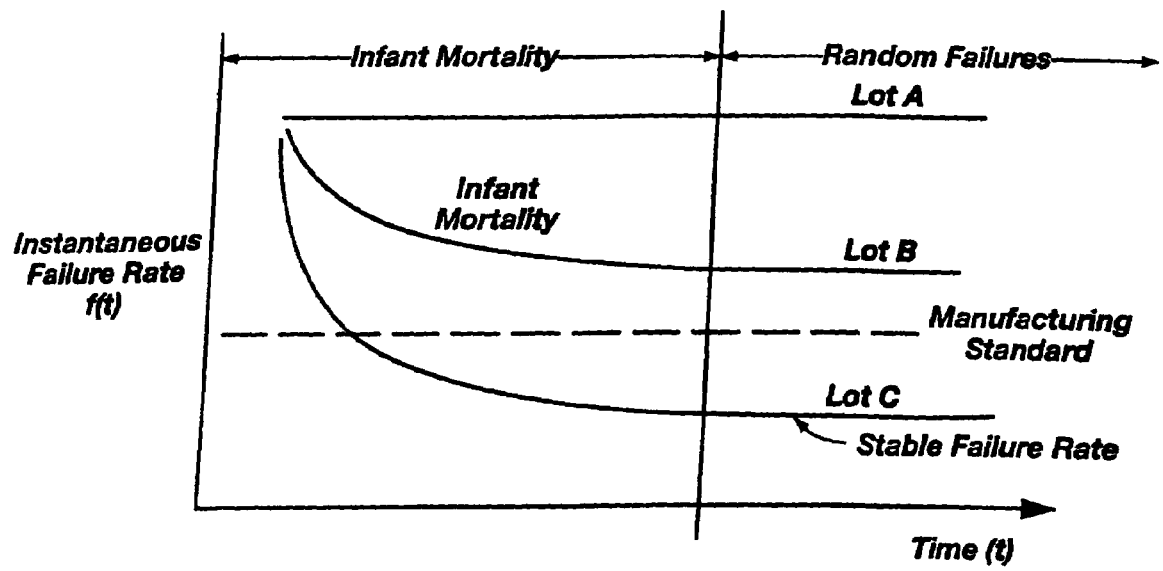
FIG. 2 illustrates reliability curves measured for integrated circuit (IC) device lots A, B and C.
Figure 3:
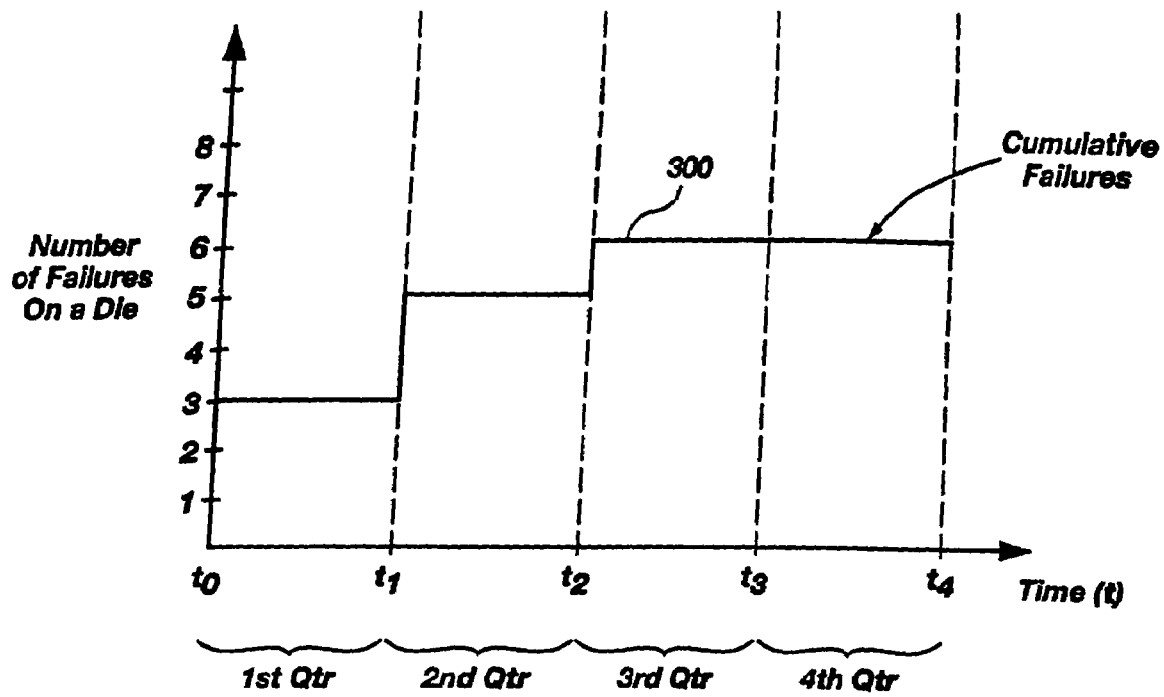
FIG. 3 is a graph of exemplary wafer level burn-in data stored in nonvolatile elements on each IC die during each cycle of burn-in testing according to the present invention.

FIG. 3 is a graph 300 of cumulative failures detected on an IC die during wafer level burn-in testing according to the present invention. As shown in FIG. 3, there may be four quarters of burn-in testing, each separated by time stamps, $t_0$–$t_4$. The number of quarters or cycles of burn-in testing is not critical to the invention. Four quarters of burn-in are illustrated only for convenience of discussion. Each quarter of burn-in testing may include "stressing" followed by "testing" to determine the number of failures. "Stressing" may be accomplished by a burn-in self-stress (BISS) mode performed, for example, by dedicated logic on each individual IC die. BISS may include exercising the part by writing and reading to locations in the memory array, for example. "Testing" may be accomplished by a burn-in self-test (BIST) mode performed, for example, by dedicated logic on each individual IC die. BIST may include writing to memory cell locations, reading the contents of the cells written to and comparing the data written against the data read as known to one of ordinary skill in the art. The BISS and BIST circuitry may be integrated as a single functional logic block with BISS and BIST test modes.

According to the present invention, the number of device failures may be detected and stored in nonvolatile elements at each time stamp, $t_0$–$t_4$. As noted above, the number of failures may be detected using an on-chip BIST. That same BIST may be used to cycle or stress the IC die during each of the four quarters of burn-in testing, for example, using a built-in self-stress (or self-burn) test mode of the BIST circuitry. The physical implementation of a "time stamp" according to the present invention may be a single bit of an n-bit register or the n-bit register itself. For example, the single bit may be used to indicate when a quarter or cycle has been or has not been completed. On-chip circuitry may be used to look at the "time stamp bit" to see if its associated register has been used. On-chip circuitry may then look for the next register with an intact time stamp bit in a predefined order for storage of new data.

Wafer level burn-in testing according to the present invention may begin with detecting the number of failures at time stamp $t_0$, prior to the first quarter of burn-in stressing. Detecting the number of failures at time stamp $t_0$ may be performed using BIST circuitry. The number of failures detected on the IC die and the time stamp may be recorded or stored in nonvolatile elements, such as antifuse registers, on the IC die itself. Then, the first quarter of burn-in stressing may be performed. At the end of the first quarter, $t_1$, the number of failures on the IC die is again detected (using BIST, for example) and stored in nonvolatile elements along with the time stamp, $t_1$. This procedure may be repeated for all four quarters of the wafer level burn-in testing, at which point the nonvolatile elements on each IC die contain wafer level burn-in testing data that may be used to generate burn-in reliability curves (bathtub curves). The nonvolatile elements may be fuses, antifuses or any other suitable nonvolatile storage elements.

Figure 4:
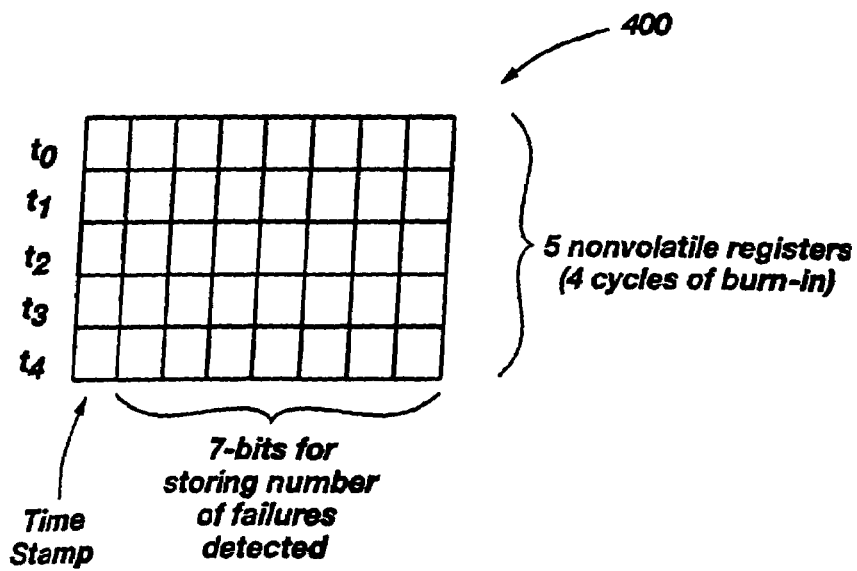
FIG. 4 illustrates a bank of antifuse registers in accordance with the present invention.

FIG. 4 illustrates a bank 400 of nonvolatile registers suitable for use as the nonvolatile elements as described above. As shown in FIG. 4, the bank 400 may include five 8-bit registers, one for each time stamp, $t_0$–$t_4$. Each 8-bit register may include one bit for a time stamp and seven bits for storing the number of failures detected at the associated time stamp. The time stamp bit may be used, for example, by a state machine or incremental pointer that increments a pointer to the registers during the cycles of the burn-in testing so that the appropriate information is stored. The number of bits per register is not critical to the invention, as more or fewer bits may be used depending on the size of the memory array being tested or the quality of the manufacturing process. Generally, there may be m+1 registers, each having n bits, where m and n are positive integers and m represents the number of cycles of burn-in testing. The physical arrangement of the bank 400 of nonvolatile registers and methods for storing information in and retrieving information from nonvolatile registers are within the knowledge of one of ordinary skill in the art and, thus, will not be further elaborated herein.

Figure 5:
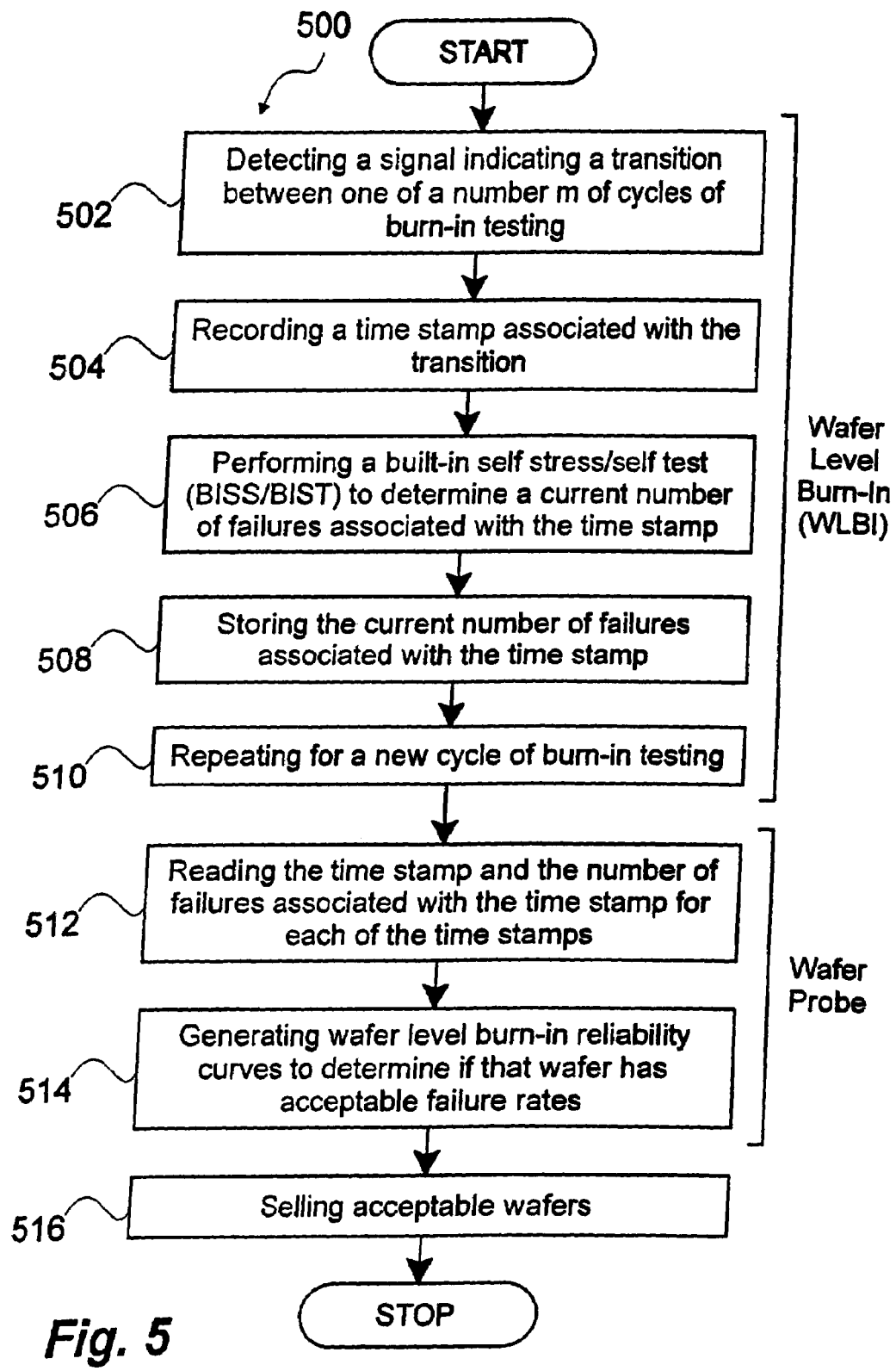
FIG. 5 is a flow chart illustrating a method for determining burn-in reliability from wafer level burn-in of the present invention.

FIG. 5 is a flow chart illustrating a method 500 for determining burn-in reliability from wafer level burn-in according to the present invention. Once a wafer has been manufactured and a sacrificial layer of metal has been placed on the wafer to provide power to the IC dice during wafer level burn-in, method 500 may include detecting 502 a signal indicating a transition between one of a number m of cycles of burn-in testing. According to one embodiment of the present invention, the number m of cycles of burn-in testing may be four quarters of burn-in testing, i.e., m=4.

During each quarter of burn-in testing, voltage levels may be elevated to greater or lesser degrees relative to nominal values in order to stress the circuitry and thereby quickly identify "infant mortality" failures. For example, if the nominal operating voltage VCC=2.5 volts, the power supply VCC may be elevated from nominal to approximately 3.4 volts during first and second quarters of burn-in. Using the same example (i.e., nominal operating voltage VCC=2.5 volts), the power supply VCC may be elevated from nominal to approximately 3.2 volts during third and fourth quarters of burn-in. Where the nominal operating voltage VCC=3.3 volts, the power supply VCC may be elevated from nominal to approximately 4.5 volts during first and second quarters of burn-in. Using the same example (i.e., nominal operating voltage VCC=3.3 volts), the power supply VCC may be elevated from nominal to approximately 4.2 volts during third and fourth quarters of burn-in.

Additionally, each cycle of burn-in testing may encompass a predefined duration, e.g., 4 to 6 hours. Various approaches to burn-in stressing ICs are within the knowledge of one of ordinary skill in the art and, thus, will not be further elaborated herein.

Any suitable signal may be used to indicate a transition between the number m of cycles of burn-in testing. According to an embodiment of the present invention, a nonvolatile supply voltage, e.g., antifuse supply (CMN) may be used to indicate a transition between cycles of burn-in testing. More specifically, a rising edge on a "supervoltage" associated with an antifuse supply CMN may be used to indicate a transition between cycles of burn-in testing. Detecting a supervoltage may be accomplished, for example, with high voltage detect circuitry (see FIG. 6 and related discussion below).

Method 500 may further include recording 504 a time stamp associated with the transition between the cycles of wafer level burn-in. The detection 502 of a signal indicating a transition between one of a number m of cycles of burn-in testing marks a transition between a built-in self-stress (BISS) mode and a built-in self-test (BIST) mode. A BIST is used to detect the number of failures that occurred as a result of the BISS to date, see below. As described above, the time stamps, $t_0$–$t_4$, may be a single bit of a register associated with storing the number of failures detected to that point in time. Additionally, the time stamps, $t_0$–$t_4$, may be used by a state machine or pointer during wafer level burn-in to cycle through the antifuse registers (i.e., nonvolatile elements).

Method 500 may further include performing 506 a BISS/BIST to determine a current number of failures associated with the current cycle as indicated by the time stamp. According to the invention, a BISS/BIST may be performed to identify the current number of failures in the IC die. Performing 506 the BISS/BIST may include compressing addresses from a memory array into redundancy space and reading errors corrected in redundancy space. Recording 504 a time stamp may be performed before or after performing 506 a BISS/BIST.

Method 500 may further include storing 508 the current number of failures associated with the particular time stamp, $t_0$–$t_4$. Storing 508 may include programming nonvolatile elements on the IC die. As described above, nonvolatile elements may be fuses, antifuses or any other nonvolatile storage elements in accordance with the present invention. As described above, the nonvolatile elements may be a bank 400 of antifuse registers, see FIG. 4 and related discussion.

According to method 500, the above steps may be repeated 510 for each new cycle of burn-in testing, e.g., each quarter of burn-in testing. The number of quarters or cycles of burn-in testing is not critical to the invention. The four quarters of burn-in testing described herein are merely exemplary. After the wafer level burn-in is complete (e.g., all four quarters of burn-in testing are complete), the sacrificial metal layer is removed and the wafer is sent to wafer probe.

Method 500 may further include reading 512 the time stamp and number of failures associated with the time stamp for each of the time stamps, i.e., the wafer level burn-in data. Reading 512 of the time stamp and current number of failures associated with the time stamp (i.e., wafer level burn-in data) is performed by wafer probe equipment. Method 500 may further include generating 514 wafer level burn-in reliability curves to determine if the wafer has acceptable failure rates. Additionally, method 500 may further include selling 516 acceptable wafers. The wafer level burn-in data may be used to generate burn-in reliability curves, i.e., bathtub curves, which in turn give a process engineer information about whether the IC dice, wafer and lot are acceptable or if there is a problem that needs to be addressed.

Figure 6:
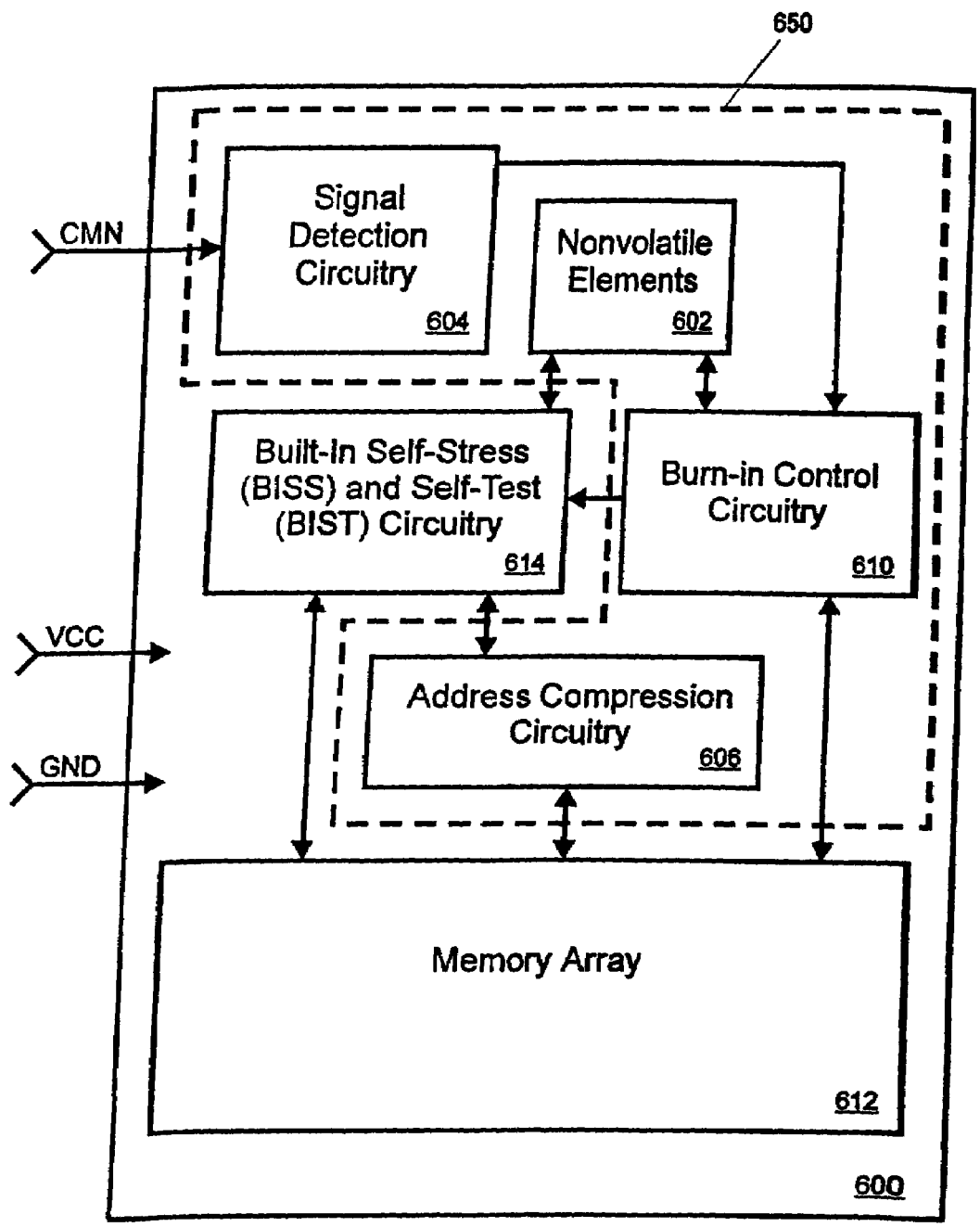
FIG. 6 is a block diagram of a memory device including wafer level burn-in circuitry of the present invention.

FIG. 6 is a block diagram of a memory device 600 suitable for fabrication as a semiconductor die including wafer level burn-in circuitry 650 of the present invention. Memory device 600 may further include built-in self-stress (BISS) and built-in self-test (BIST) circuitry 614 and a memory array 612, both of which are in communication with the wafer level burn-in circuitry 650. Wafer level burn-in circuitry 650 may include nonvolatile elements 602 configured for storing defect information detected during each stage of burn-in testing. Nonvolatile elements may be fuses, antifuses or any other suitable nonvolatile data storage element. In an embodiment of the present invention, nonvolatile elements may form a bank of antifuse registers. As noted above, the bank of antifuse registers may include five 8-bit antifuse registers. Each antifuse register may have a time stamp bit, seven bits for storing the number of failures detected. The nonvolatile elements 602 are formed on the die itself.

Wafer level burn-in circuitry 650 may also include signal detection circuitry 604 for detecting a signal indicating initiation of a cycle of wafer level burn-in testing. Signal detection circuitry 604 may be high voltage detect circuitry suitable for detecting the initiation of a short supervoltage pulse on an antifuse supply CMN. Of course, one of ordinary skill in the art will recognize that there are many signal detection circuits that are suitable for the purposes of the present invention. All such suitable signal detection circuits are considered to be within the scope of the present invention.

Wafer level burn-in circuitry 650 may also include address compression circuitry 606 which may be coupled to the memory array 612 and the BISS and BIST circuitry 614 for compressing cells of a memory array into redundancy space. Repairable failures can have variations in bit counts. Most memory IC dice are not prime (free from defects). Compression in redundancy space may occur for either column-repair space or row-repair space. For example, a 4 Mb SRAM may be compressed into 1024 row-elements or 144×4 column-elements. The size of the redundancy space (within the memory array) and the choice of column-repair space or row-repair space is usually based on various design, architectural, yield and real estate (die size) tradeoffs, all of which are within the knowledge of one of ordinary skill in the art and, thus, will not be further elaborated upon herein.

Wafer level burn-in circuitry 650 may also include burn-in control circuitry 610 which may be coupled to nonvolatile elements 602, signal detection circuitry 604 and memory array 612 for controlling wafer level burn-in. Burn-in control circuitry 610 may also be configured for programming time stamp bits and to facilitate reading of the wafer level burn-in data stored in the nonvolatile elements 602. Burn-in control circuitry 610 may include a state machine or incremental pointer to facilitate programming of time stamp bits and antifuse registers.

As shown in FIG. 6, memory device 600 may include a memory array 612 including redundancy space, not shown separately as it is included in the memory array 612. Address compression circuitry 606 is in communication with the memory array 612 and the BISS and BIST circuitry 614 for compressing memory array addresses into redundancy space. The memory array 612 may have redundant rows and/or columns for making a repair by switching in redundant elements as known to one of ordinary skill in the art. Memory device 600 may further include burn-in control circuitry 610 in communication with the memory array 612 for controlling wafer level burn-in and storing wafer level burn-in data in the nonvolatile elements 602. Signal detection circuitry 604 is in communication with the burn-in control circuitry 610 for detecting a signal indicating a transition between wafer level burn-in stress and self-test modes. As described above, the signal may be a short supervoltage pulse on an antifuse supply CMN. Built-in self-stress circuitry (BISS) and built-in self-test (BIST) circuitry 614 is on die circuitry that may be used to stress the die at elevated supply voltages and to detect failures after each cycle of stress which are recorded in nonvolatile elements 602, as discussed above.

Wafer level burn-in circuitry 650 of the present invention may be used in any higher order digital logic device or IC which may be suitable for wafer level burn-in to generate burn-in reliability curves. Memory device 600 may be, for example and not by way of limitation, a dynamic random access memory (DRAM), double data rate synchronous DRAM (DDR SDRAM), RAMBUS® DRAM (RDRAM®), extended data-out DRAM (EDO DRAM), fast-page-mode DRAM (FPM DRAM), static random access memory (SRAM), SyncBurst™ SRAM, Zero Bus Turnaround™ SRAM (ZBT™ SRAM), Quad Data Rate™ SRAM (QDR™ SRAM), double data rate synchronous SRAM (DDR SRAM) and nonvolatile electrically block-erasable programmable read only memory (Flash).

Figure 7:
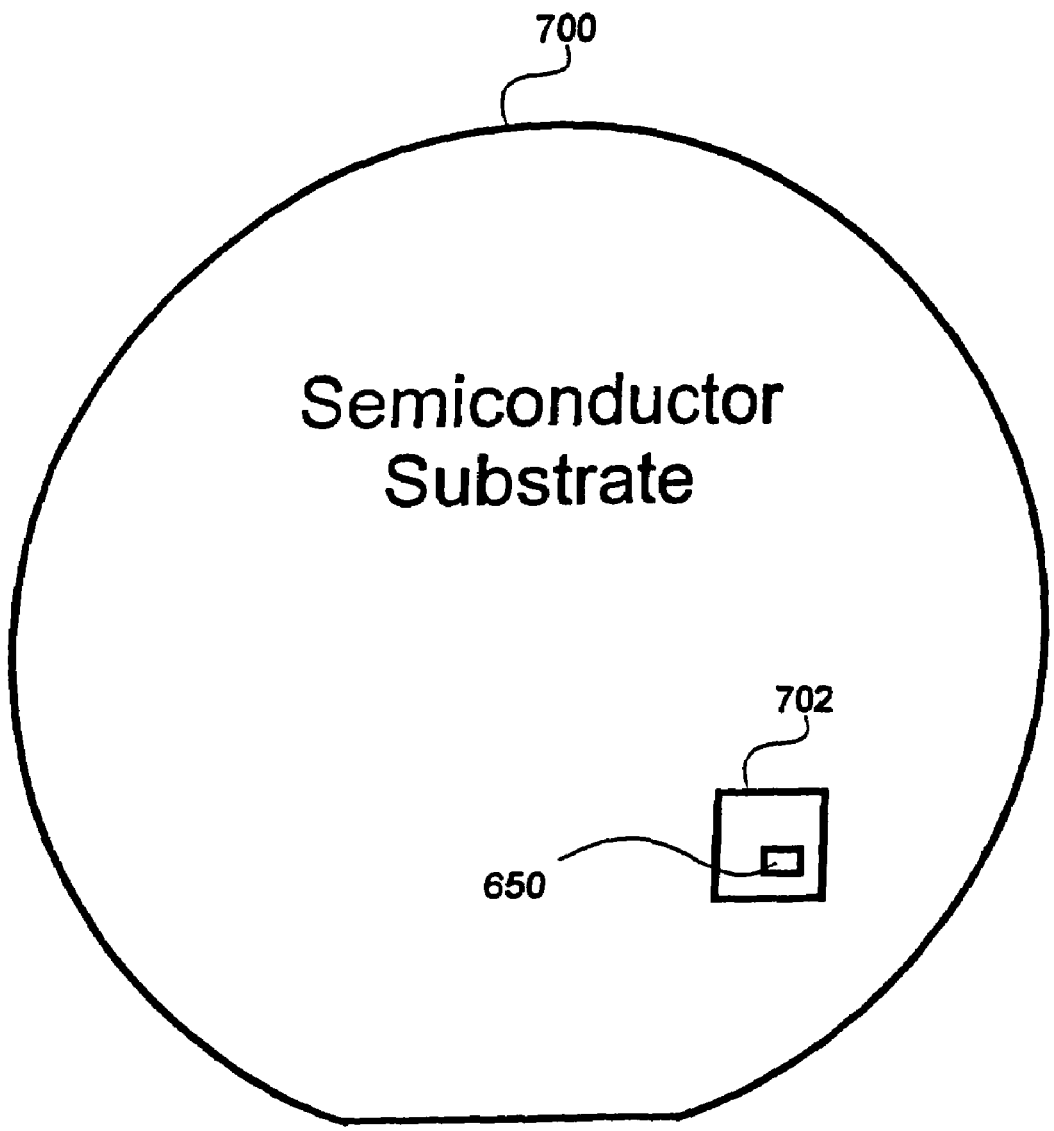
FIG. 7 is a plan view of a semiconductor substrate including at least one IC die having wafer level burn-in circuitry of the present invention.

Referring to FIG. 7, a plan view of a bulk semiconductor substrate 700 configured as a wafer is shown including a plurality of IC dice, only one IC die 702 being shown for clarity. Each IC die 702 may include wafer level burn-in circuitry 650 of the present invention. IC die 702 may be a memory device as described above, or it may be any other integrated circuit die that includes wafer level burn-in circuitry 650 of the present invention. Semiconductor substrate 700 may also be a large scale bulk substrate comprising a layer of semiconductor material, other than a conventional silicon wafer.

Figure 8:
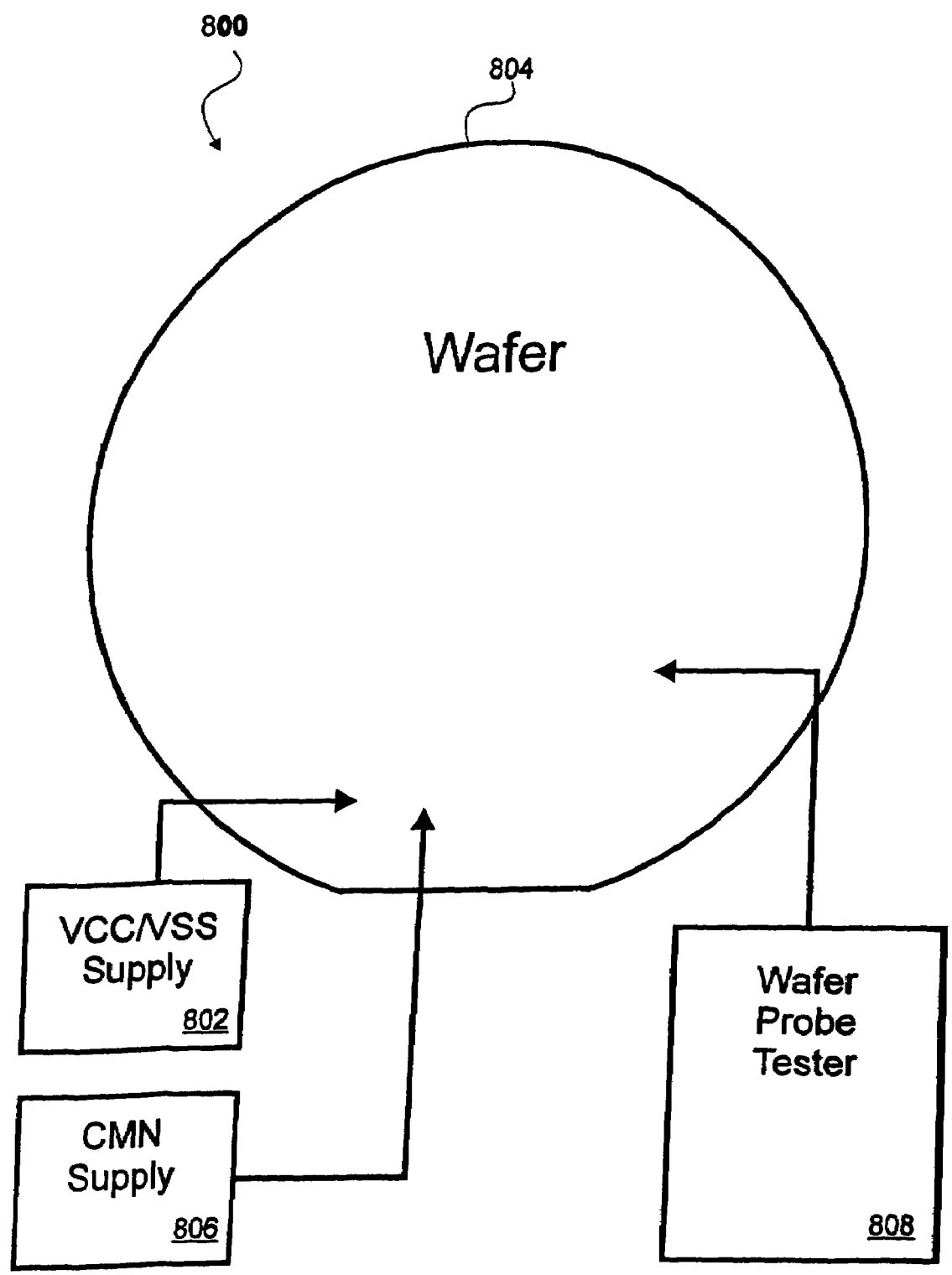
FIG. 8 is a block diagram of a system for performing wafer level burn-in circuitry of the present invention.

FIG. 8 is a block diagram of a system 800 for performing wafer level burn-in in accordance with the present invention. System 800 may include a high current VCC/VSS power supply 802 configured for providing power, VCC, and ground, VSS, to a wafer 804 during wafer level burn-in through a sacrificial metal layer on the wafer 804. System 800 may further include a high current power supply CMN 806 suitable for programming nonvolatile elements. High current power supply CMN 806 may also be used to provide a supervoltage that may be detected by supervoltage detection circuitry in each IC die. The supervoltage provides a logic signal to switch between a BISS mode and a BIST mode and for storing failures detected in nonvolatile elements (wafer level burn-in data) in accordance with the present invention. Wafer level burn-in data may be stored in nonvolatile elements (not shown) in each IC die (also not shown) on the wafer 804. Wafer 804 may be bulk semiconductor substrate 700 as described above with regard to FIG. 7. System 800 may further include a wafer probe tester 808 for reading the wafer level burn-in data to generate at least one wafer level burn-in reliability curve in accordance with the present invention. Wafer probe tester 808 may be used to effect repairs in each of the IC dice on the wafer 804 by programming in redundant elements.

The semiconductor technology employed is not a limiting factor in the application of the circuits and systems of the present invention. While silicon is the presently preferred bulk semiconductor material for commercial electronic devices, gallium arsenide and indium phosphide substrates may also be employed. Of course, it will be understood that the devices of the present invention may be fabricated on other semiconductor substrates as well, including, for example, silicon-on-glass (SOG) substrates, silicon-on-insulator (SOI) substrates, and silicon-on-sapphire (SOS) substrates.

Although this invention has been described with reference to particular embodiments, the invention is not limited to these described embodiments. The invention is limited only by the appended claims, which include within their scope all equivalent devices or methods that operate according to the principles of the invention as described herein.

What is claimed is:

1. A semiconductor device, comprising:
a memory array;
nonvolatile elements configured for storing wafer level burn-in data; and
burn-in control circuitry operably coupled to the memory array and the nonvolatile elements and configured for controlling operation of a wafer level burn-in test and for controlling storing of the wafer level burn-in data in the nonvolatile elements.

2. The semiconductor device of claim 1, further comprising address compression circuitry operably coupled to the memory array and the burn-in control circuitry and configured for compressing memory array addresses into a redundancy space.

3. The semiconductor device of claim 1, wherein the burn-in control circuitry is further configured to facilitate reading the wafer level burn-in data from the nonvolatile elements for generating a burn-in reliability curve.

4. The semiconductor device of claim 1, further comprising a sacrificial layer configured for delivering power comprising at least a VCC signal and a VSS signal to the semiconductor device during the wafer level burn-in test.

5. The semiconductor device of claim 1, further comprising signal detection circuitry operably coupled to the burn-in control circuitry and configured for detecting a burn-in test signal indicating a transition between a wafer level burn-in self-stress mode and a wafer level burn-in self-test mode.

6. The semiconductor device of claim 5, further comprising a sacrificial layer configured for delivering power comprising at least a VCC signal and a VSS signal to the semiconductor device during the wafer level burn-in test.

7. The semiconductor device of claim 6, wherein the sacrificial layer is further configured for delivering a CMN signal to the semiconductor device for programming the nonvolatile elements and delivering the burn-in test signal to the signal detection circuitry.

8. Wafer level burn-in circuitry comprising:
nonvolatile elements configured for storing wafer level burn-in data;

signal detection circuitry configured for detecting a signal indicating initiation of a cycle of a wafer level burn-in test; and burn-in control circuitry operably coupled to the nonvolatile elements, the signal detection circuitry, built-in self-stress (BISS) circuitry, and built-in self-test (BIST) circuitry, the burn-in control circuitry configured for controlling the wafer level burn-in test.

9. The wafer level burn-in circuitry of claim 8, wherein the nonvolatile elements comprise a number m+1 of n-bit nonvolatile registers for storing failures detected before and after m cycles of wafer level burn-in, wherein m and n each comprise positive integers.

10. The wafer level burn-in circuitry of claim 9, wherein each of the n-bit nonvolatile registers comprises one bit for a time stamp and n−1 bits for storing a number of failures detected.

11. A bulk substrate including at least one integrated circuit (IC) die, wherein the at least one IC die comprises:
   a memory array;
   address compression circuitry in communication with the memory array and configured for compressing memory array addresses into redundancy space;
   nonvolatile elements configured for storing wafer level burn-in data; and
   burn-in control circuitry in communication with the memory array and the nonvolatile elements and configured for controlling cycling of a wafer level burn-in test and for controlling storage of the wafer level burn-in data in the nonvolatile elements.

12. The bulk substrate of claim 11, wherein the burn-in control circuitry is further configured to facilitate reading the wafer level burn-in data from the nonvolatile elements for generating a burn-in reliability curve.

13. The bulk substrate of claim 11, further comprising a sacrificial layer configured for delivering power comprising at least a VCC signal and a VSS signal to the at least one IC die during the wafer level burn-in test.

14. The bulk substrate of claim 11, further comprising signal detection circuitry operably coupled to the burn-in control circuitry and configured for detecting a burn-in test signal indicating a transition between a wafer level burn-in self-stress mode and a wafer level burn-in self-test mode.

15. The bulk substrate of claim 14, further comprising a sacrificial layer configured for delivering power comprising at least a VCC signal and a VSS signal to the at least one IC die during the wafer level burn-in test.

16. The bulk substrate of claim 15, wherein the sacrificial layer is further configured for delivering a CMN signal for programming the nonvolatile elements and delivering the burn-in test signal to the signal detection circuitry.

17. A semiconductor wafer, comprising:
   a bulk semiconductor wafer comprising semiconductor devices formed thereon;
   a layer configured for delivering power comprising at least a VCC signal and a VSS signal to the semiconductor devices during a wafer level burn-in test, and the layer also configured for removal after completion of the wafer level burn-in test.

18. The semiconductor wafer of claim 17, wherein the layer is further configured for delivering a CMN signal for delivering a burn-in test signal to a signal detection circuit on the semiconductor devices.

19. The semiconductor wafer of claim 17, wherein the layer is removed.

* * * * *